US005231374A

United States Patent [19]

Larsen et al.

[11] Patent Number: 5,231,374

[45] Date of Patent: Jul. 27, 1993

[54] APPARATUS AND METHOD FOR ACQUIRING ELECTRICAL SIGNALS FROM ROTATING MEMBERS

[75] Inventors: Hugh W. Larsen, Milford; Ralph W. Larsen, Charlevoix; David A. Hoffer, Walled Lake, all of Mich.

[73] Assignee: Michigan Scientific Corporation, Milford, Mich.

[21] Appl. No.: 765,155

[22] Filed: Sep. 23, 1991

[51] Int. Cl.[5] ...................... G08B 21/00; H01R 39/08; H05K 5/00

[52] U.S. Cl. .................................... 340/540; 310/232; 324/706; 340/521; 361/399; 439/24

[58] Field of Search ............... 340/540, 671, 515, 521; 310/232; 364/474.16, 474.17; 324/706; 73/66, 570, 660; 439/23-26; 361/397, 18, 52, 399, 403; 200/237, 252

[56] References Cited

U.S. PATENT DOCUMENTS 4,068,909 1/1978 Jacobson et al. .................... 439/24
4,294,500 10/1981 Wilson ................................. 439/26
4,418,342 11/1983 Aschoff et al. ................. 340/540 X
4,728,834 3/1988 Kumar et al. ...................... 310/68 R
4,870,311 9/1989 Chase et al. ......................... 310/232

*Primary Examiner*—Thomas Mullen
*Attorney, Agent, or Firm*—Basile and Hanlon

[57] ABSTRACT

A slip ring includes a rotor and a stator. Stator contacts are connected to a data acquisition unit. The rotor contacts are connected to an amplifier circuit mounted in a housing connected to and rotatable with a rotating member. A sensor mounted on the rotating member to which the rotor is also fixedly mounted generates an electrical output signal corresponding to a sensed operating parameter of the rotating member. The sensor output signal is amplified by the amplifier in the housing before being transmitted through the slip ring to the data acquisition unit. Vibration isolation is provided when required for the slip ring and the circuit board in the housing carrying the amplifier to dampen vibrations generated by the rotating member. Resilient pads are mounted on the circuit board and engage the housing attached to the rotor.

29 Claims, 8 Drawing Sheets

APPARATUS AND METHOD FOR ACQUIRING ELECTRICAL SIGNALS FROM ROTATING MEMBERS

BACKGROUND OF THE INVENTION

1. Field of the Invention

The present invention relates, in general, to devices for conducting electrical signals between bodies undergoing relative rotational motion and, more specifically, to electrical slip rings.

2. Description of the Art

Electrical slip rings are widely used to conduct electrical signals between a first stationary body and a second body undergoing rotation relative to the first body. A typical slip ring includes a stator and a rotor rotatably connected thereto. A number of brushes and contact rings are mounted on the stator and rotor and are disposed in continuous sliding contact, unless a brush lifter mechanism which separates the brushes from the contact rings is activated. One to several brushes may be in contact with each contact ring. Either the brushes or the contact rings may be mounted on the rotor; while the mating contact ring or brush is mounted on the stator.

Slip rings have been used to provide a connection path for a variety of sensors, such as strain gages, thermocouples, pressure transducers, resistance temperature devices (RTDs), torque transducers, accelerometers, velocity sensors, etc., mounted on a rotating member, such as a train axle or wheel, an automobile wheel, etc., to a data acquisition unit located on the train or vehicle remote from the sensor. In instrumentation systems involving a large number of sensors, the number of brushes and contact ring pairs in the slip ring becomes extensive since each signal requires a separate conductive path, i.e., a separate brush/contact ring pair, through the slip ring. Although some common connections of power and ground leads can be implemented, such does not significantly reduce the number of brush/contact pairs required in a slip ring. The result is a large and therefor expensive slip ring. This is a detrimental factor, not only from a cost standpoint, but also in certain applications where space is at a minimum. In such applications, a large slip ring cannot be used.

Another factor encountered in such sensor based instrumentation system is the introduction of false signals or noise onto the sensor output. The use of such instrumentation systems on moving vehicles, trains, etc., exposes the extremely low level signals from the sensors to random external electrical signal generating sources, such as RFI and EMI generators, etc. These devices generate electrical and magnetic fields and electrical signals which can cause false signals or noise within the sensor output signal which introduces errors into the recorded data.

Further, in certain applications, such as instrumentation systems employed on trains, the sensors are located a considerable distance from the data acquisition unit. This requires long cables or conductor runs between the sensors and the data acquisition unit. Such conductors or cables are sensitive to temperature which effects their resistance and, further, the long cable lengths can introduce a voltage drop in the signals due to the resistance of the conductors. This again effects the accuracy of the data received by the data acquisition unit.

Thus, it would be desirable to provide a slip ring for use in a rotating electrical signal generating data acquisition apparatus which overcomes the aforementioned problems relating to the use and construction of slip rings. It would also be desirable to provide a data acquisition apparatus which minimizes the introduction of erroneous electrical signals caused by RFI, EMI and other sources. It would also be desirable to provide such an apparatus which has a small size for easy mounting on an existing rotatable member undergoing testing. It would also be desirable to provide such an apparatus which minimizes noise and cable losses between the sensors and a remote data acquisition unit. It would also be desirable to provide such an apparatus which eliminates the need for costly cable requirements between the sensors and the data acquisition unit. Finally, it would be desirable to provide such an apparatus which is constructed to reduce the number of separate number of individual sensors.

SUMMARY OF THE INVENTION

The present invention is a rotating electrical signal generating data acquisition apparatus which is particularly useful in collecting data relating to predetermined operating parameters of a rotating member.

The apparatus includes a slip ring formed of a stator means having stator contacts mounted thereon and electrically connected to a stationary portion of a device undergoing testing. The slip ring also includes a rotor rotatably connected to the stator means and to a rotating member undergoing testing. Rotor contact means are mounted on the rotor means and electrically connected via sliding contacts to the stator contact means. A housing is attached to the rotor means and is also connected to the rotating member. Amplifier and power supply means are mounted in the housing and electrically connected to at least one sensor mounted on the rotating member which senses an operating parameter of the rotating member. The amplifier means amplifies electrical signals generated by the sensor. The amplified sensor output is transmitted by the rotor and stator contact means to a remotely located data acquisition unit.

In a single sensor embodiment of the present invention, the amplifier means is mounted on a circuit board which is itself mounted in the housing attached to the rotating member. The circuit board is suitably isolated to protect the amplifier means mounted thereon from vibrations caused by the rotating member. In addition to the amplifier means, a regulated power supply circuit is also mounted on the circuit board in the housing to supply regulated power to the sensor. In the case of a strain gage sensor or transducer, the regulated power is supplied across a resistive wheatstone bridge containing the strain gage transducer. The output of the sensor is input to the amplifier means which preferably comprises a differential input, single output amplifier. A calibration circuit is also mounted on the circuit board and connected between the regulated power supply and the sensor to drive the sensor output, when selectively activated, to a known magnitude to indicate proper operation of the apparatus.

In a multiple sensor apparatus, at least one or more circuit boards are mounted in a housing attached to the rotating member. Each circuit board may be dedicated to a particular type of sensor, such as a strain gage sensor, a thermocouple, etc., or individual circuits to different sensors may be intermixed on a single circuit board. In one embodiment, the housing containing the sensor output amplifier(s) and power supply(s) is co-axially mounted between the slip ring rotor and the rotating member. In an alternate embodiment, the housing containing the amplifier(s) and power supply circuit(s) is attached to the rotating member at a radially spaced location from the attachment location of the slip ring rotor to the rotating member. However, the amplifier and power supply circuit in the housing still rotates concurrently with both the rotating member and the slip ring rotor.

A single power supply applied to the slip ring stator is used to power all amplifier channels and, in the case of sensors requiring excitation, the power supply is divided into independently regulated power supply circuit or each sensor on the rotating means. A calibration circuit employing a selectively activated switch means, such as one or more FETs, is connected between a regulated sensor power supply circuit and the sensor. The calibration circuit, when activated, introduces a shunt resistor in parallel with a bridge arm to simulate the sensor output to a known magnitude to indicate proper operation of the sensor and circuitry. Each sensor is provided with a differential amplifier having a single output. The single amplifier output may be optionally coupled through buffer amplifier means to enable the transmission of the amplifier sensor output signal over long distances to a remotely located data acquisition unit.

Individual circuits containing a regulated power supply, amplifier and buffer amplifier means for each sensor are mounted on the circuit board in the housing attached to the rotor means.

In order to break ground loops and to eliminate any noise which may be introduced into the conductors extending from the amplifier means, through the slip ring to the data acquisition unit, optional pre-digitizing filters may be connected to the conductors attached to the slip ring stator contacts to provide filtering of the amplified sensor output signals. The amplified sensor output signals are then input to a data acquisition unit, such as a strip recorder, oscilloscope, computer, etc., for recording, monitoring, display or further analytical processing.

The apparatus of the present invention provides several advantages and overcomes many of the problems associated with previous data acquisition systems utilizing electrical slip rings. The most important feature provided by the apparatus of the present invention is the mounting of the amplifier means on the rotating side of the slip ring, i.e., between the sensor(s) and the slip ring. The low level output signals from the sensors are amplified up to 1,000 times or more which practically eliminates any noise or spurious signals which may be introduced into the sensor output by the slip ring or other sources. Such amplification on the rotating side of the slip ring also eliminates cable or conductor losses in the transmission of the sensor outputs to the remote data acquisition unit as well as reducing sensitivity to external RFI or EMI interference.

In addition, the use of a differential amplifier having a single output substantially reduces the number of separate channels or brush/contact ring pairs required in the slip ring for a given number of sensors. This enables the number of signal channels and sensors to be increased while maintaining a much smaller slip ring than has been previously possible.

The apparatus in some embodiments also includes unique vibration isolation means associated with the circuit board containing the amplifier and power supply circuits to minimize vibration damage to such circuits since they are mounted on the rotating side of the slip ring. The vibration isolation means is preferably in the form of a plurality of resilient pads which exhibit spring force and which are mounted on the periphery of the circuit board in resilient contact between the circuit board and the surrounding housing which is hard-mounted to the rotating member. These same resilient pads may also provide vibration isolation for the slip ring assembly. In addition, resilient bumpers are mounted on the surface(s) of the circuit board and extend outward from at least one and preferably both sides of the circuit board into engagement with the end portions of the housing to absorb vibration forces generated by the rotating member. This enables the amplification and power supply circuits to be uniquely mounted on the rotating side of the slip ring in an isolated manner with the rotating member undergoing testing.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1:
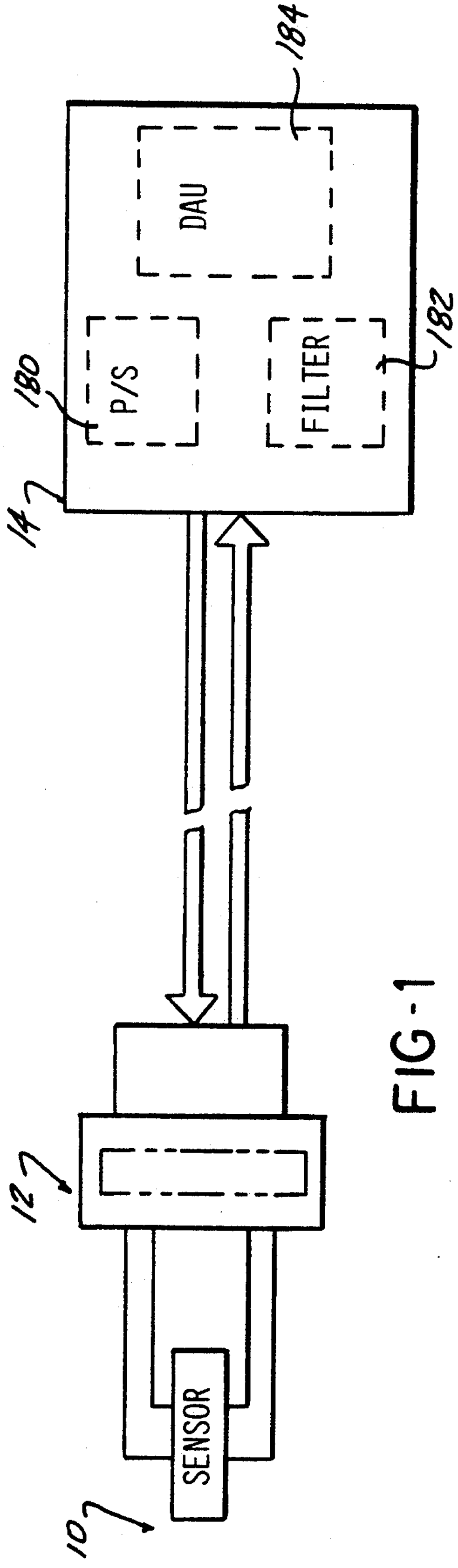
FIG. 1 is a block diagram of one embodiment of the apparatus of the present invention.

Referring now to the drawing, and to FIG. 1 in particular, there is illustrated an apparatus for collecting data relating to operating parameters of a rotating member and for transmitting such data through a rotating electrical contact assembly, such as a slip ring, to a remotely located data acquisition means. The rotating member, not shown, may be any rotating member or device wherein it is desirable to determine various operating parameters of the member or device, such as pressure, strain, temperature, acceleration, velocity, etc. Such rotating members may comprise, but are not limited to, automobile wheels, train axles and wheels, airplane propellers, etc.

A sensor means 10 is mounted on the rotating member for sensing one operating parameter of the rotating member. Such sensor 10 may comprise any suitable sensor, such as a strain gage, thermocouple, resistance temperature device (RTD), accelerometer, velocity transducer, pressure transducer, etc. The low level output from the sensor 10 is input to a rotating electrical contact assembly, such as a slip ring 12. The slip ring assembly 12 includes a rotor and stator for transmitting the electrical signals from the sensor 10 which is rotating with the rotating member to a stationarily and remotely located data acquisition means denoted in general by reference number 14. The data acquisition means 14 may be mounted on the vehicle or apparatus containing the rotating member being tested or it may be physically located separate from the rotating member.

Figure 2:
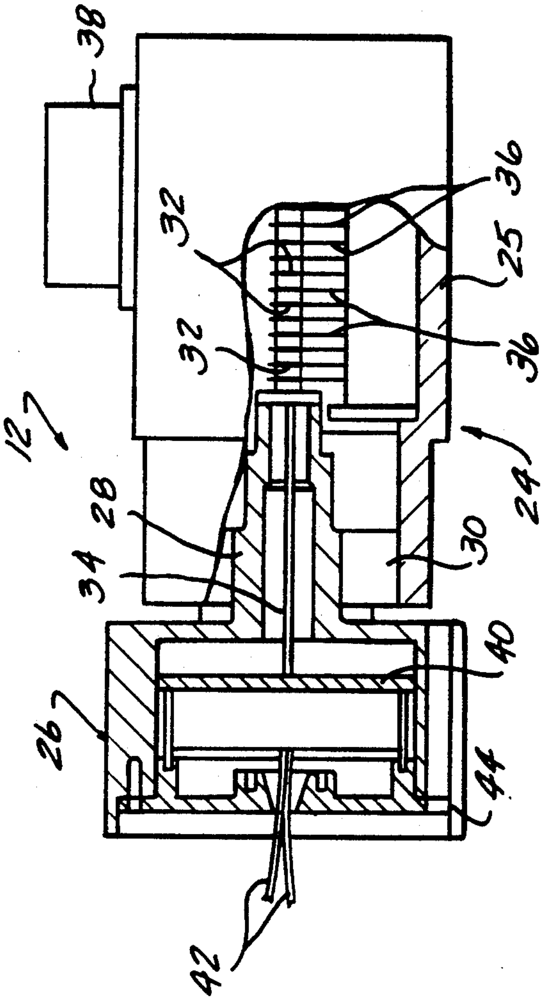
Figure 2 is a cross sectional view of one embodiment of a slip ring used in the apparatus shown in FIG. 1.
Figure 3:
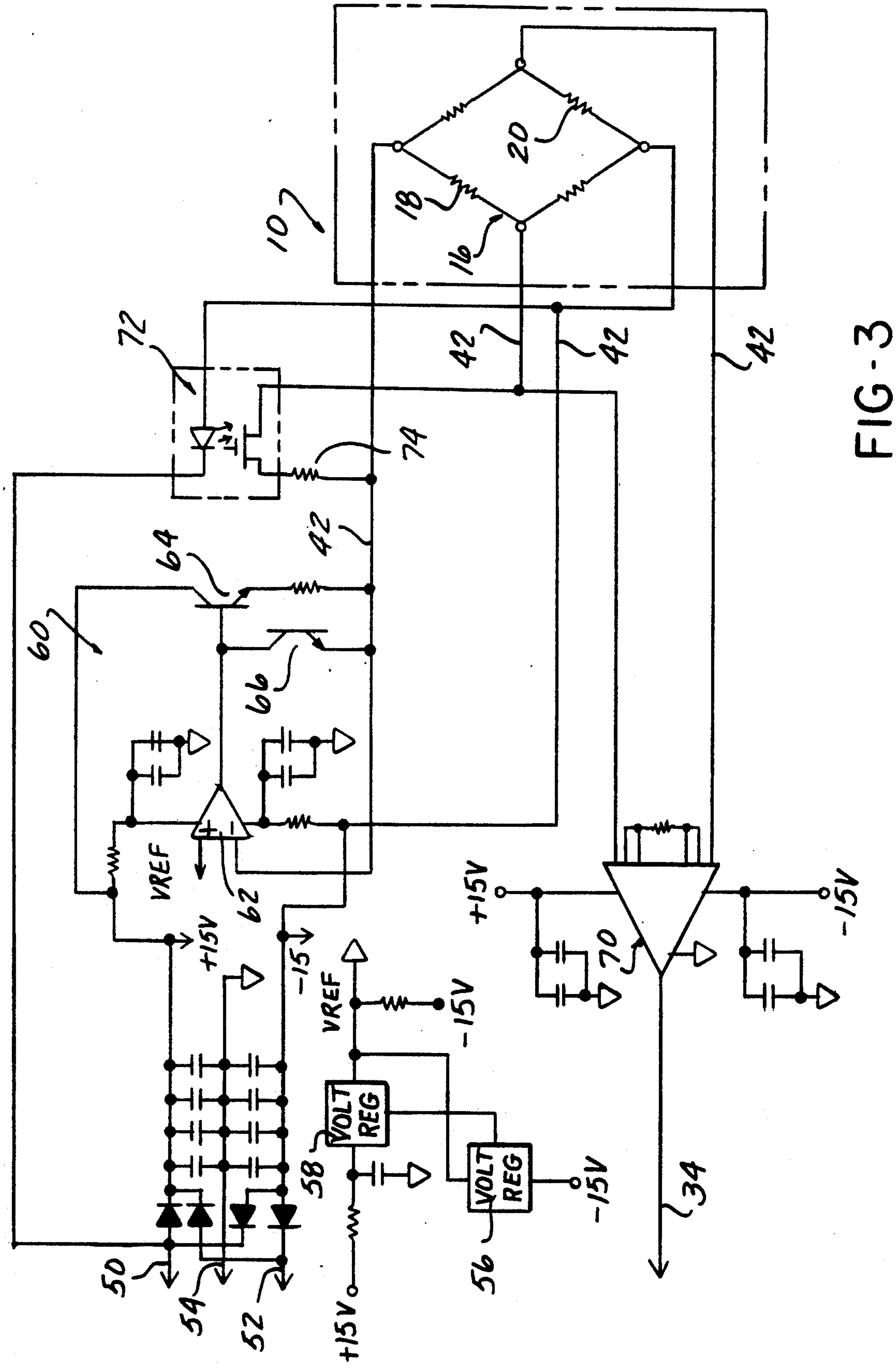
FIG. 3 is a schematic diagram of one embodiment of a circuit mounted in the housing attached to the slip ring shown in FIG. 2.

In a first embodiment of the present invention, as shown in FIGS. 1, 2 and 3, a single sensor version of the present invention is depicted. In this embodiment, the sensor 10 is depicted as comprising a strain gage which utilizes a resistive wheatstone bridge 16. Forces exerted on the strain gage by the rotating member to which it is attached results in an unbalance of two sensing resistors 18 and 20 in the bridge 16, which resistance change can be sensed to indicate the amount of force exerted on the rotating member.

As shown in FIG. 3, four conductors 42 are attached to the sensor 10. Two of the conductors 42 comprise high and low voltage supply signals, while the two other conductors 42 or leads represent outputs from the bridge 16.

Before describing the electrical power connections to the sensor 10 and the transmission of electrical output signals from the sensor 10 to the data acquisition means 14, a brief description will be presented relating to the construction of the slip ring 12. As shown in FIG. 2, the slip ring 12 comprises a conventional slip ring formed of a stator means 24 which is stationarily mounted to stationary support structure on the device undergoing testing and a rotatable rotor means 26 rotatably mounted in the stator means 24. An example of such a conventional slip ring 12 which may be employed in a first embodiment of the present invention is a slip ring manufactured by Michigan Scientific Corporation, Milford, Mich., as Model No. SR20MW.

The rotor 26 in the slip ring 12 includes a spindle 28 which is rotatably mounted in a housing 25 of the stator means 24 via bearing 30. A plurality of individual, spaced, annular contact rings 32 are mounted on one end of the spindle 28. The annular contact rings 32 are formed of an electrically conductive material. Electrical conductors or leads 34 extend from circuitry, described hereafter, connected to the output of the sensor 10 to conduct electrical signals to the contact rings 32. Each conductor 34 is electrically connected to a separate contact ring 32 thereby forming a separate electrical conductive path or channel. A plurality of stator contact means 36 are mounted in the housing 25 of the stator means 24 and are each disposed in electrical contact with one contact ring 32 on the rotor 26. The stator contact means 36 preferably comprises an electrically conductive brush in the form of a spring member which contacts one of the contact rings 32 as shown in FIG. 2. Electrical conductors, not shown, extend from each stator contact or brush 36 outward through a suitable connector 38 from the stator 24 to the data acquisition means 14.

According to the present invention, an amplifying means is mounted on the rotor 26 and connected to the sensor 10 for amplifying the output of the sensor 10 to a high level to minimize noise and reduce electrical losses in the transmission of the sensor output to the data acquisition means 14. In the embodiment shown in FIG. 2, a housing 44 is formed as an integral part of the rotor 26 and extends outward from the housing 25 of the stator 24. The spindle 28 of the rotor 26 is attached to one end of the housing 25 by means of the bearing 30. The housing 44 is fixedly connected via suitable fasteners, not shown, to the rotating member undergoing testing. The electrical leads or conductors 42 to and from the sensor 10 extend through the housing 44 into electrical contact with a circuit board 40 fixedly mounted in the housing 44. The amplifier means as well as other circuits, described hereafter and shown in FIG. 3, are mounted on the circuit board 40.

Input power from the data acquisition means 14 is supplied to the circuit board 40 in the form of +15 V, −15 V, and ground signals, respectively depicted by reference numbers 50, 52 and 54 in FIG. 3. These signals pass through a suitable filter network and are connected to the various operating components of the amplifier and the sensor excitation circuit as described hereafter. In addition, the +15 V and −15 V signals 50 and 52, respectively, are connected to a pair of voltage regulators 56 and 58 to generate a $V_{REF}$ signal which is supplied to the various components of the amplifier and sensor excitation circuit. It will be understood that the 15 volt signals supplied to the amplifier means of the present invention are exemplary only as any DC voltage level may be supplied depending upon the type of components employed in the amplifier and sensor excitation circuit.

In the case of a sensor 10 utilizing a resistive bridge 16, such as a strain gage sensor, a bridge excitation circuit 60 is connected to the +15 V and −15 V power signals. The bridge excitation circuit 60 includes an operational amplifier 62 whose output is connected to a pair of transistors 64 and 66. The bridge excitation circuit 60 provides a constant voltage across the bridge 16.

The amplifier means, as denoted by reference number 70 in FIG. 3, comprises a precision operational amplifier having two differential inputs and a single output. The amplifier 70 may have any selected gain from 1 to 1,000 or more and can be set during the construction of the apparatus 10 or adjusted during use. Alternately, a chopper-stabilized amplifier may be used for the amplifier means 70.

The output leads 42 from the resistive bridge 16 employed in the sensor 10 are connected to differential inputs of the amplifier 70. The difference between these output signals is amplified by the gain of the amplifier 70 and output as an amplified signal on conductor 34 which extends from the circuit board 40 on which the amplifier 70 is mounted to the rotor means 26 of the slip ring 12. This output signal passes through the contact ring 32 and stator contact brush 36 before being transmitted to the remotely located data acquisition means 14.

The circuit shown in FIG. 3 is also operative to detect proper connection and operation of the amplifier 70 and the sensor 10. This may be achieved by reversing the polarity of the input power leads 50 and 52. This polarity reversal will generate an output from the bridge 10 which will be detected by a switch means 72, such as an FET. When activated by the polarity reversal, the switch 72 connects a shunt resistor 74 across one bridge arm which drives the sensor 10 output to high magnitude, for example. During manufacture and calibration of the sensor 10, the sensor output for a given shunt resistance is documented. When polarity reversal occurs during operation of the apparatus, the magnitude of the sensor output can be recorded and compared to the magnitude documented during calibration of the sensor 10. This allows the user to determine proper operation and connection of the amplifier 70 and the sensor 10 at any time during use of the apparatus.

Other sensors utilize or require different excitation currents for proper operation or require no excitation at all. In the case of a thermocouple sensor, a cold junction compensation circuit, as described hereafter, is employed in place of the resistive bridge 16.

Referring now to FIGS. 4, 5, 6 and 7, there is depicted another embodiment of the present invention which is configured for use with a plurality of sensors attached to a rotating member which detect separate operating parameters of the rotating member. Although the following example is depicted in use with a train wheel, it will be understood that this apparatus may be employed with any type of rotating member having multiple sensors mounted thereon.

Figure 4:
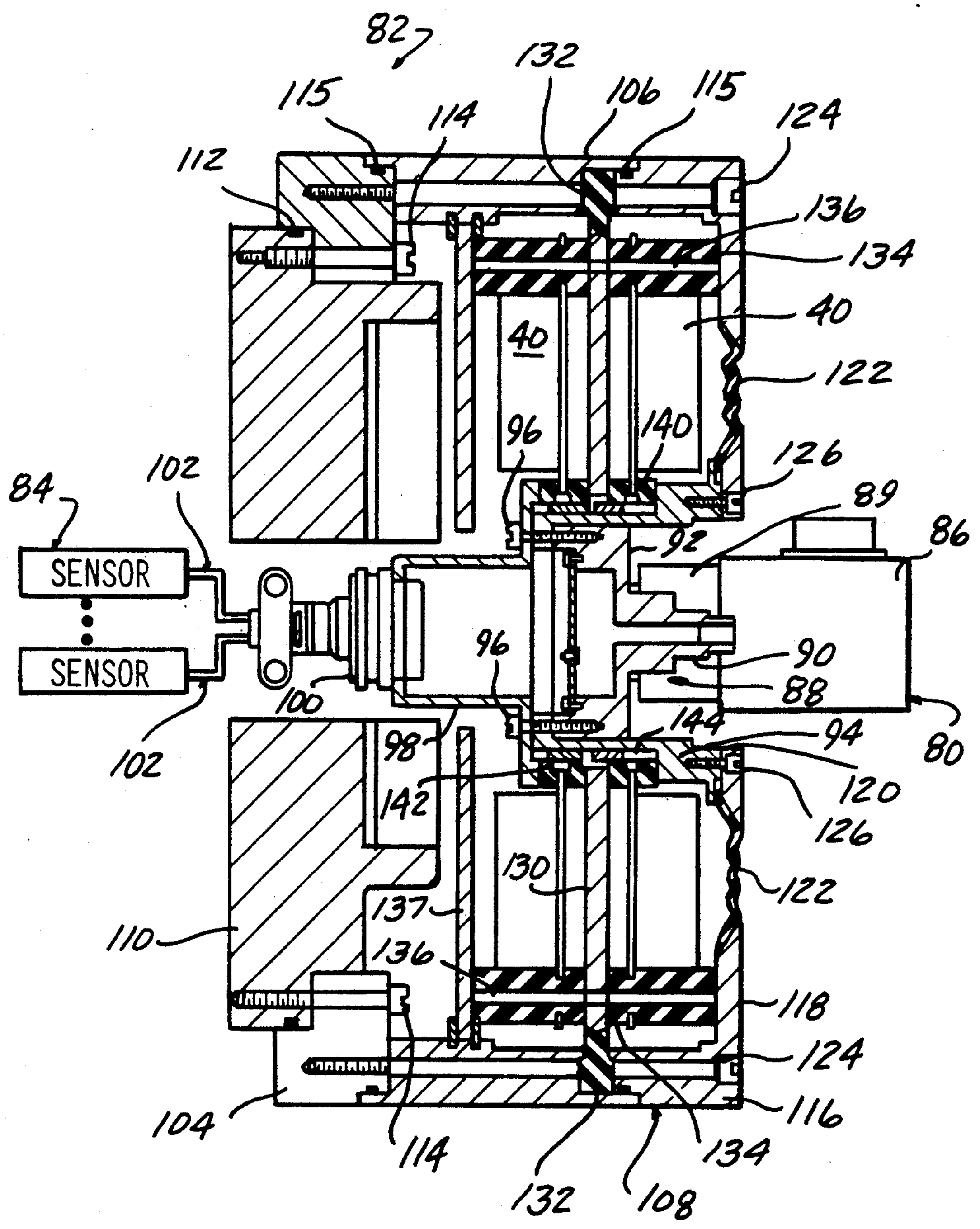
FIG. 4 is a cross sectional view through a second embodiment of the apparatus of the present invention.
Figure 5:
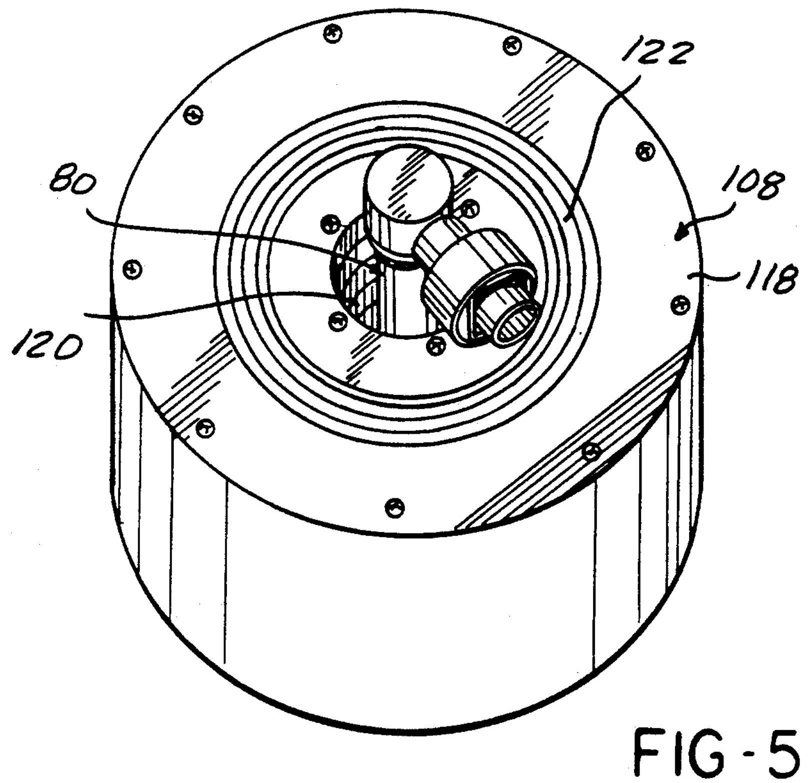
FIG. 5 is a perspective view showing the end portion of the apparatus shown in FIG. 4.

As shown in FIG. 4, the apparatus includes a slip ring 80, a housing 82 and a plurality of individual sensors 84. The sensors 84 may comprise any of the sensors described above, such as strain gages, thermocouples, and other transducers for measuring various operating parameters of the rotating member.

The slip ring 80 may comprise any conventional slip ring, such as a slip ring manufactured by Michigan Scientific Corporation, Milford, Mich., Model No. SR20MW. The slip ring 80 includes a stator 86 which is fixedly connected to a stationary support structure. A rotor 88 is rotatably coupled to the stator 86 by a bearing 89. As described above in the first embodiment of the present invention, the rotor 88 includes a rotatable spindle 90. The spindle 90 is hollow, as shown in FIG. 4, to provide a conduit for the passage of electrical conductors, not shown, from circuitry mounted in the housing 82, as described hereafter.

The rotor spindle 90 includes an enlarged end portion 92 which extends outward from the main rotor housing. An annular hub 94 having a circular, hollow interior is mounted about the enlarged end portion 92 and is attached thereto by suitable fasteners 96, such as socket head cap screws, which extend through an annular end flange on the hub 94 into the periphery of the enlarged end portion 92 of the rotor 90. The fasteners 96 also attach a retaining ring 98 to the hub 94. The retaining ring 98 has an annular, outwardly extending end flange which engages the hub 94. The retaining ring 98 also includes an elongated sleeve portion which receives a standard electrical connector 100 at one end. The connector 100 provides suitable connection for the leads 102 from each of the sensors 84 into the interior of the housing 82.

The housing 82 is formed of an adapter ring 104, a central member 106 and an end cover 108. The adapter ring 104 has a generally annular shape and mates in registry with the periphery of a shoulder formed in an end cap 110 which does not form part of the housing 82; but which is part of the rotating member to which the housing 82 is attached. The end cap 110 is attached to the rotating member, such as a train wheel or axle, for example, by suitable bolts, not shown. The adapter ring 104 is sealed to the end cap 110 by an annular seal ring 112. Fasteners 114 extend through the adapter ring 104 into the periphery of the end cap 110 to secure the adapter ring 104 to the end cap 110.

The central housing member 106 is sealed to the adapter ring 104 and the end cover 108 at opposite ends via seal rings 115.

The end cover 108 has an annular side wall 116, a perpendicular end wall 118 and a centrally located bore 120 through which the slip ring 80 extends. An annular opening is formed in the end wall 118 and is closed by a silicone seal member 122 in the form of a resilient bellows. The purpose of the bellows 122 is to seal the interior of the housing 82 from the environment.

Fasteners 124, such as socket head set screws, extend through aligned bores in the side wall 116 of the end cover 108, the central housing member 106, and the adapter ring 104 to secure these elements together to form a rigid, sealed housing 82 about the circuit elements mounted therein.

The inner edge of the end wall 118 of the end cover 108, adjacent the central bore 120 in the end wall 118 is secured to a flanged end of the hub 94 by a plurality of fasteners 126.

At least one or more circuit boards 40 are mounted in spaced relationship within the interior of the housing 82. The circuit boards 40 contain the amplification and power supply circuits of the present apparatus which are described in greater detail hereafter.

The apparatus includes vibration isolation means for isolating the circuit boards 40 from vibrations or forces exerted on the housing 82 during rotation of the rotating member which are transmitted from the rotating member through the end cap 110 to the housing 83. The vibration isolation means includes an annular support plate 130 which is vibration isolated from the housing 82 and, in particular, from the central housing portion 106 by a plurality of resilient mounts 132. The resilient mounts 132 exhibit spring characteristics and are formed of a suitable resilient material, such as silicone. The mounts 132 are spaced about the circumference of the annular support plate 130 and seat within an annular recess formed in the central housing member 106.

The vibration isolation means also includes a plurality of bumpers or standoffs 134 which are mounted on the support plate 130 and extend outward from a surface of the support plate 130 to support each circuit board 40. The bumpers or standoffs 134 are spaced about the circumference of the support plate 130 and are secured to the support plate 130 by suitable fasteners 136. The standoffs 134 have a longitudinal length sufficient to extend completely between the support plate 130 and a protective cover 137 spaced from the support plate 130 and mounted to the central housing member 106. The standoffs 134 extending from the other surface of the support plate 130 engage the end wall 118 of the end cover 108. The standoffs 134 are formed of a resilient material, such as silicone, to absorb or dampen any vibrations which are transmitted to the housing 82 by the rotating member.

Each circuit board 40 includes a plurality of radially outward located apertures, each of which receives a standoff 134 therethrough, as shown in FIG. 4. The inner edges of each circuit board 40 bounding a central aperture therein, are resiliently mounted to the hub 94 by spacer rings 140. The spacer rings 140 are formed of a resilient material, such as silicone, and are disposed between a flange on the retaining ring 98, the circuit board 40 and the support plate 130. The spacer rings 140 on the opposite side of the support plate are disposed between the circuit board 40, and the support plate 130, and between the circuit board 40 and a shoulder formed on the hub 94. Spacer rings 142 and 144 are disposed between the inner edge of the spacers 140 and the sleeve portion of the hub 94.

A centrally located aperture is formed in each circuit board 40. A plurality of terminals, not shown, are mounted about the periphery of the aperture and are electrically connected to the circuit elements mounted on each circuit board 40.

Figure 7:
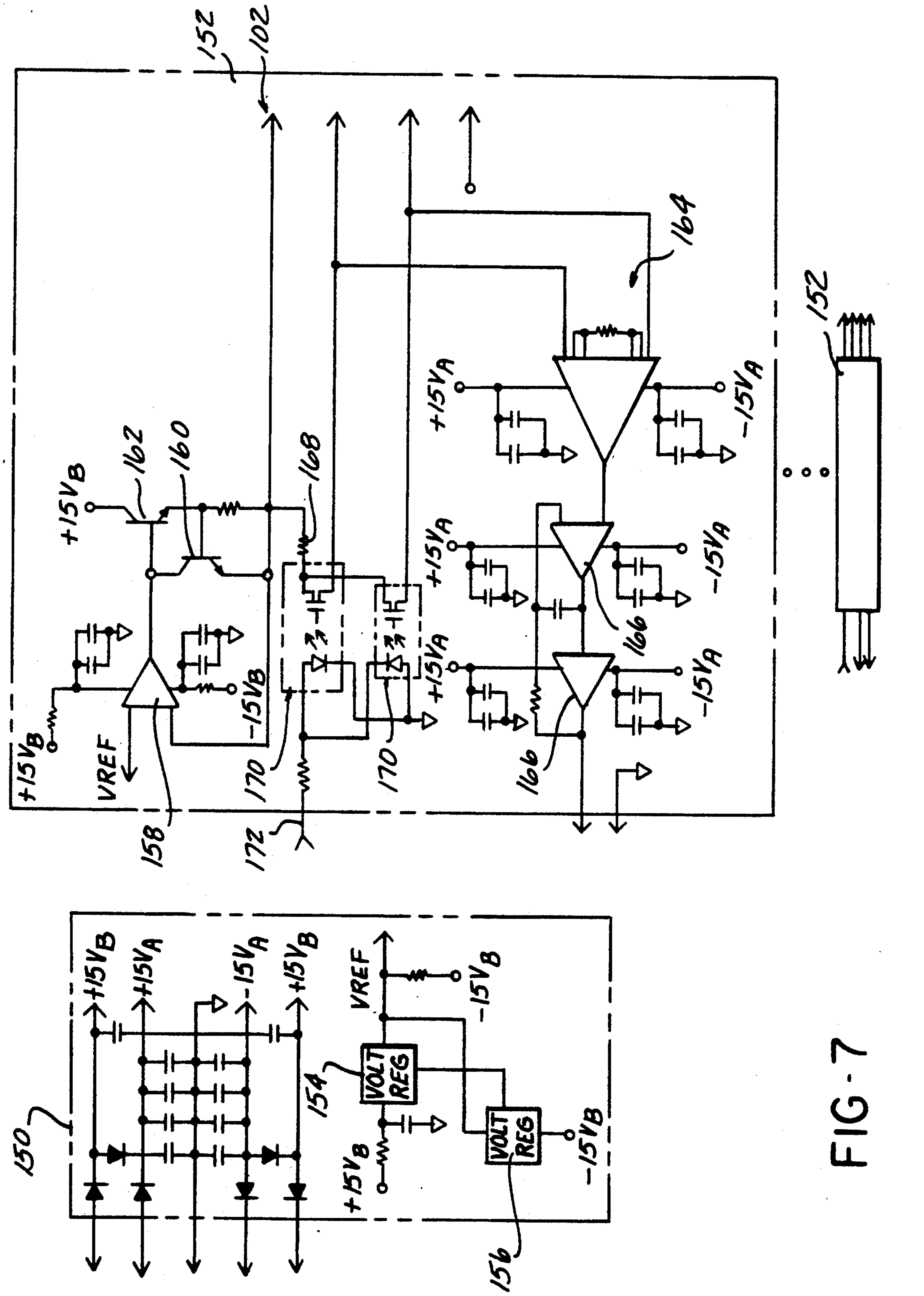
FIG. 7 is a schematic diagram of the circuits mounted on the circuit board shown in FIG. 6.

Referring now to FIG. 7, there is depicted a typical circuit which may be mounted on a circuit board 40 in the housing 82. The circuit provides power and amplification to the sensors 84 mounted on the rotating member undergoing testing.

Figure 6:
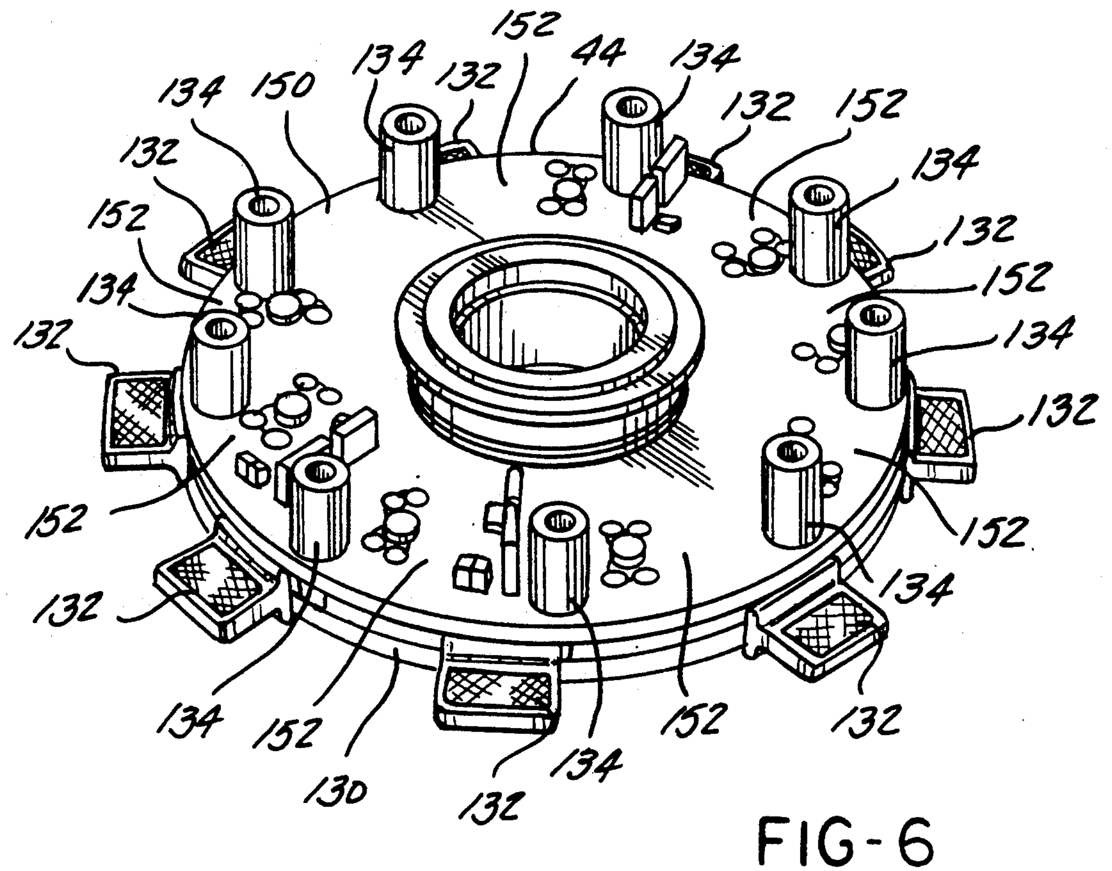
FIG. 6 is a perspective view of the circuit board containing the amplifier and power supply circuits employed in the second embodiment of the apparatus of the present invention.

In general, the circuit shown in FIG. 7 is for a multisensor apparatus which, by example, includes a main power supply circuit 150, and a plurality of excitation and amplification circuits 152 which are connected to each individual sensor 84. The power supply circuit 150 and the individual excitation and amplification circuits 152 are circumferentially spaced about the circuit board 40 as shown in FIG. 6.

The power supply circuit 150 receives input power, which by way of example only, is ±15 VDC from the data acquisition unit 14. Separate input leads are provided to provide separate $\pm V_B$ and $\pm V_A$ signals to provide separate power to the bridge and amplifier circuits as described hereafter. The separate power supply to the amplifier and the bridge enables the bridge excitation power to be discontinued while maintaining power to the amplifier. This can be used to detect the magnitude of amplifier offsets and the presence of any undesirable electrical noise received by the sensor 84. Voltage regulators 154 and 156 supply a regulated output voltage labelled $V_{REF}$ to the various components in the excitation and amplifier circuits 152.

In the preferred example of the present invention, each amplifier circuit 152 is identically constructed. As such, only one of the circuits 152 will be described in detail hereafter. It will be understood that other variants of the excitation and amplifier circuits may also be mounted on the same circuit board 40. Alternately, amplifier circuits for different sensors may be mounted on separate circuit boards 40, as shown in FIG. 4.

The $V_{REF}$ signal is input to an amplifier 158 in the bridge excitation circuit which drives a pair of transistors 160 and 162. The output of the transistors 160 and 162 provides a constant voltage to the bridge, i.e., bridge 16 in FIG. 3, employed in an exemplary strain gage sensor 84. Bridge excitation leads are connected via conductors 102 to the appropriate nodes of the bridge 16. The remaining two nodes on the bridge 16 are also connected by two conductors as bridge outputs to an amplifier means 164. The amplifier means 164 preferably comprises a precision, differential input, single output amplifier having a gain of unity or better. The gain may be set during the manufacture of the amplifier 164 or may be user adjustable.

As in the first embodiment, the output of the amplifier 164 is transmitted through one set of rotor and stator contacts of the slip ring 80 to the data acquisition means 14. This signal which is amplified by the amplifier 164 is at a higher level than the low level signal output from the sensor 84 itself. Also, the amplifier 164 lowers the impedance of the signal voltage to about zero. This renders the signal immune to noise and other interference which could lead to erroneous signal information. For long cable or conductor lengths between the slip ring 80 and the remotely located data acquisition means 14, buffer amplifiers 166 are connected to the output of the amplifier 164.

The apparatus of the present invention is uniquely provided with calibration means in the form of a shunt resistor 168 which is connected to the bridge outputs of the sensor 84. Switch means 170 under input signal control selectively connects the shunt resistor 168 to the resistive bridge arms of the sensor 84. The switch means 170 preferably comprises controllable transistors, such as FETs, which are activated by an input signal on line 172 through the slip ring 80 from the data acquisition means 14. The activation of the switch means 170 by the data acquisition means 14 will connect the shunt resistor 168 across the bridge sensor 84 and thereby cause the output of the sensor 84 to be driven to a known magnitude previously established during manufacture and calibration of the sensor 84. In this manner, the connection and operation of the sensor may be checked at any time by activation of the calibration means.

The shunt resistor 168, when switched into the circuit by the switches 170, will be shunted across the bridge arms to give positive and negative calibrations at the point where the bridge conductors enter the amplifier circuit 152. A positive calibration is performed by applying a positive voltage to the appropriate channel on the slip ring 80. A negative calibration is performed by applying a negative voltage to the same channel on the slip ring 80.

As in the first embodiment, the data acquisition means 14 includes a suitable power supply which may be either 115 volts AC or any DC level. This is transformed to the appropriate level, such as 15 VDC, required by the sensors 84 and the signal conditioning or amplification circuits.

Pre-digitizing, FIG. 2, are connected between the data acquisition unit 184 and the output of the amplifiers 164. The filters may be of any type, such as Butterworth, Bessel, Chebyshev, etc. The filters may have any number of poles and any desired amount of attenuation. The output of the filter may be connected to an analog to digital converter which converts the analog output of the amplifiers 164, after they have passed through the filters 182 to a digital value suitable for recordation by a digital acquisition unit 184. The data acquisition means 184 may be of any suitable type, such as a strip chart recorder, a computer, an oscilloscope, etc., which is capable of recording and/or displaying the amplified outputs of the sensors 84.

Figure 8:
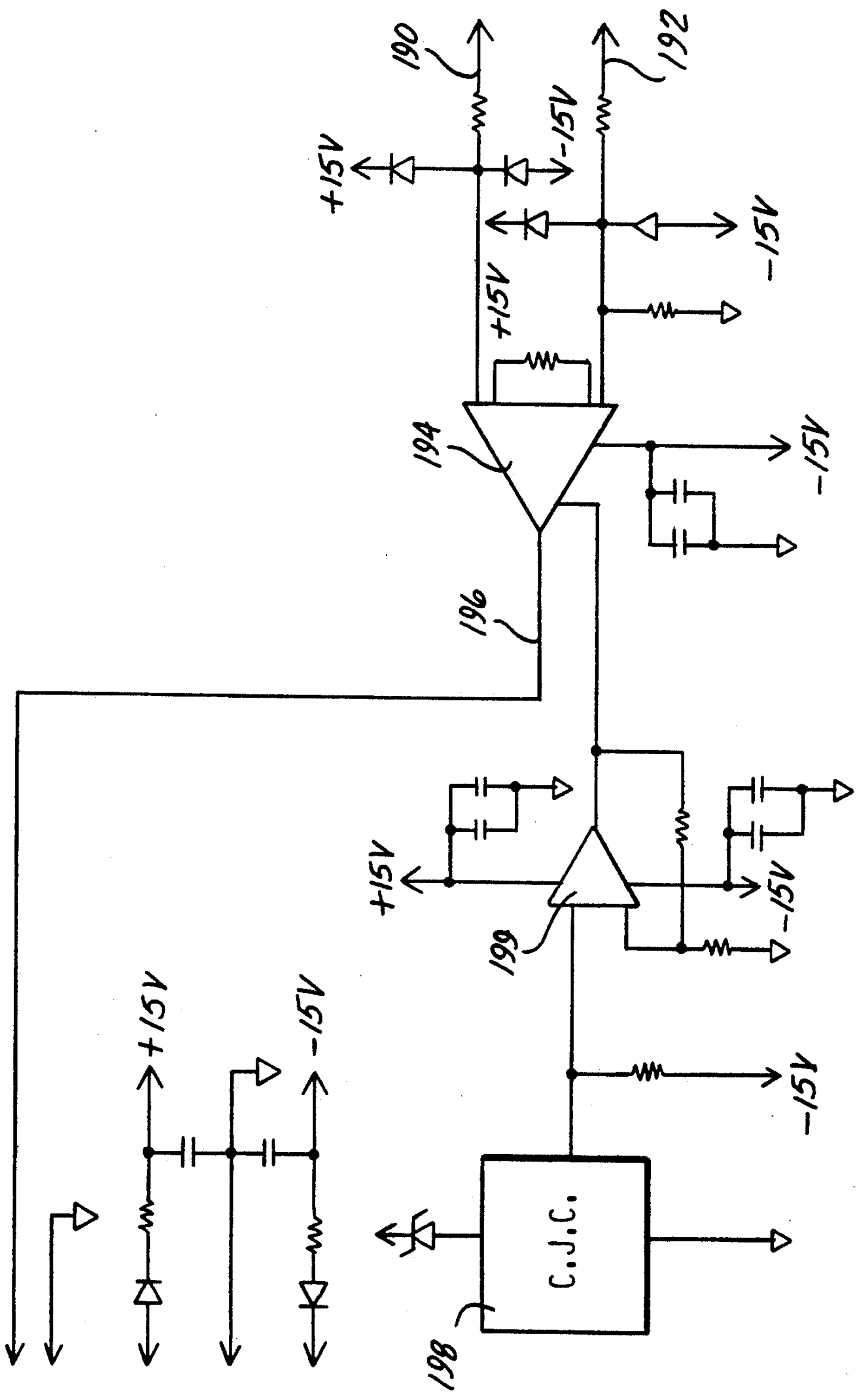
FIG. 8 is a schematic diagram of another circuit which can be mounted on the circuit board shown in FIG. 6 for use with a thermocouple sensor.

FIG. 8 depicts an amplification circuit usable with a thermocouple sensor. Since a thermocouple self-generates a voltage, no excitation circuit is required. Such a sensor may be employed in the circuit shown in FIG. 8 or as one or all of a plurality of circuits mounted on a circuit board 40 as shown in FIG. 6.

In this configuration, the circuit board 40 is provided with short leads of thermocouple material having thermocouple connectors on the ends thereof. The thermocouple leads are electrically attached by the connectors to input wires denoted by reference numbers 190 and 192. The thermocouple probe, or junction, is mounted on the rotating member. The thermocouple inputs 190 and 192 are connected as differential inputs to an operational amplifier 194. As the type of thermocouple determines the gain, the gain of the amplifier 194 is chosen so that the change in thermocouple output at 25° C. equal 10 mV per degree C. at the output of the amplifier 194. The amplifier 194 output 196 is connected via a normal copper conductor to the rotor/stator contacts in the slip ring. Further, normal copper leads can be used to transmit signals from the slip ring to the data acquisition unit 184.

This configuration provides a significant benefit over slip ring apparatus without rotary thermocouple amplifiers. Traditionally, thermocouple material leads must be continuously run from the sensor probe to the slip ring rotor and from the slip stator to the remote data acquisition unit 14. In this traditional arrangement, there will be an error in the temperature measurement data equal to the temperature difference from the rotor to the stator. This is due to the internal wiring of the slip ring which is not made of thermocouple material. In the present invention, there is zero error due to the temperature difference from the rotor to the stator. Also, copper leads may be run from the slip ring to the data acquisition unit 14 with zero error due to temperature.

As with all thermocouple circuits, a cold junction compensation means or circuit 198 is connected directly at the point the thermocouple inputs 190 and 192 are attached to the circuit board on which the amplifier 194 is mounted. The cold junction compensation circuit 198 provides an output signal through a buffer amplifier 199. The output of the buffer amplifier 199 acts as a voltage offset to the amplifier 194 and adds a voltage to the output 196 of the amplifier 194 corresponding to the temperature at the "cold junction". A ±15 V power supply circuit is also shown in FIG. 8 for supplying appropriate DC power to the various amplifiers and circuits of the thermocouple amplification circuit described above.

Figure 9:
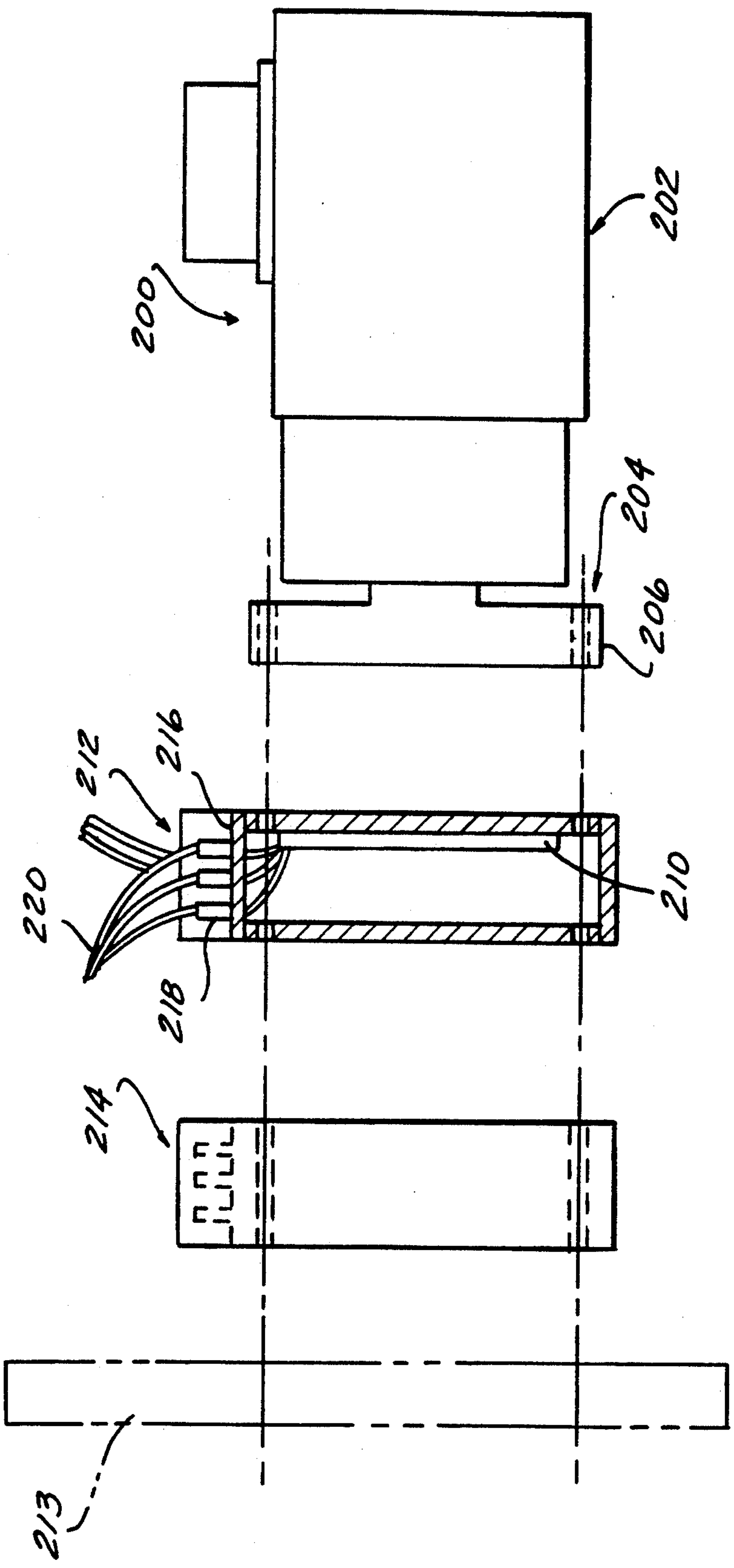
FIG. 9 is a partially cross sectioned, exploded elevational view showing another embodiment of the present invention.

FIG. 9 depicts another embodiment of the present invention in which the housing containing the sensor output amplifier(s) and power supply circuit(s) is separate from the rotor of a slip ring. The slip ring 200 shown in FIG. 9 may be nay conventional slip ring, such as that shown in FIG. 2 and described above. The main difference between the rotor 204 of the slip ring 200 shown in FIG. 9 and the rotor of the slip ring 12 shown in FIG. 2 is that the rotor 204 has an enlarged end portion 206 of a minimal depth.

Contrary to the embodiment shown in FIG. 2, the rotor 204 does not contain the sensor output amplifier and power supply circuit. Rather, the sensor output amplifier(s) and power supply circuit(s) are mounted on a circuit board 210 fixedly mounted in a separate housing 212 which is attachable to a portion of the rotating member 213 and, optionally, to the rotor 206 by means of suitable fasteners, such as bolts, not shown, extending through aligned apertures in the rotor end portion 206, the housings 212 and 214 and the rotating member 213. It should be noted that one or more housings, such as housings 212 and 214, may be axially stacked in line between the rotor 206 of the slip ring 200 and the rotating member 213.

As shown in FIG. 9, the housing 2121 is formed with a peripheral recessed portion 216 in which a plurality of pins or terminals 218 are mounted. The pins or terminals 218 provide connections between leads 220 extending to the sensor or sensors mounted on the rotating member 213, the internal rotor contacts in the slip ring 200 and the circuit board 210.

By way of example only, in the case of a strain gage sensor, the amplifier and power supply circuit, which may be that shown above and described in FIG. 3, is mounted on the circuit board 210 in the housing 212. Alternately, two thermocouple sensor amplifier and output circuits, such as that shown in FIG. 8 and described above, may be mounted in the housing 212 or the housing 214. Multiple housings 212 and 214 may be axially aligned and between the rotor 206 and the rotating member 13 to provide connection between various sensors mounted on the rotating member and the contacts in the slip ring 200.

Figure 10:
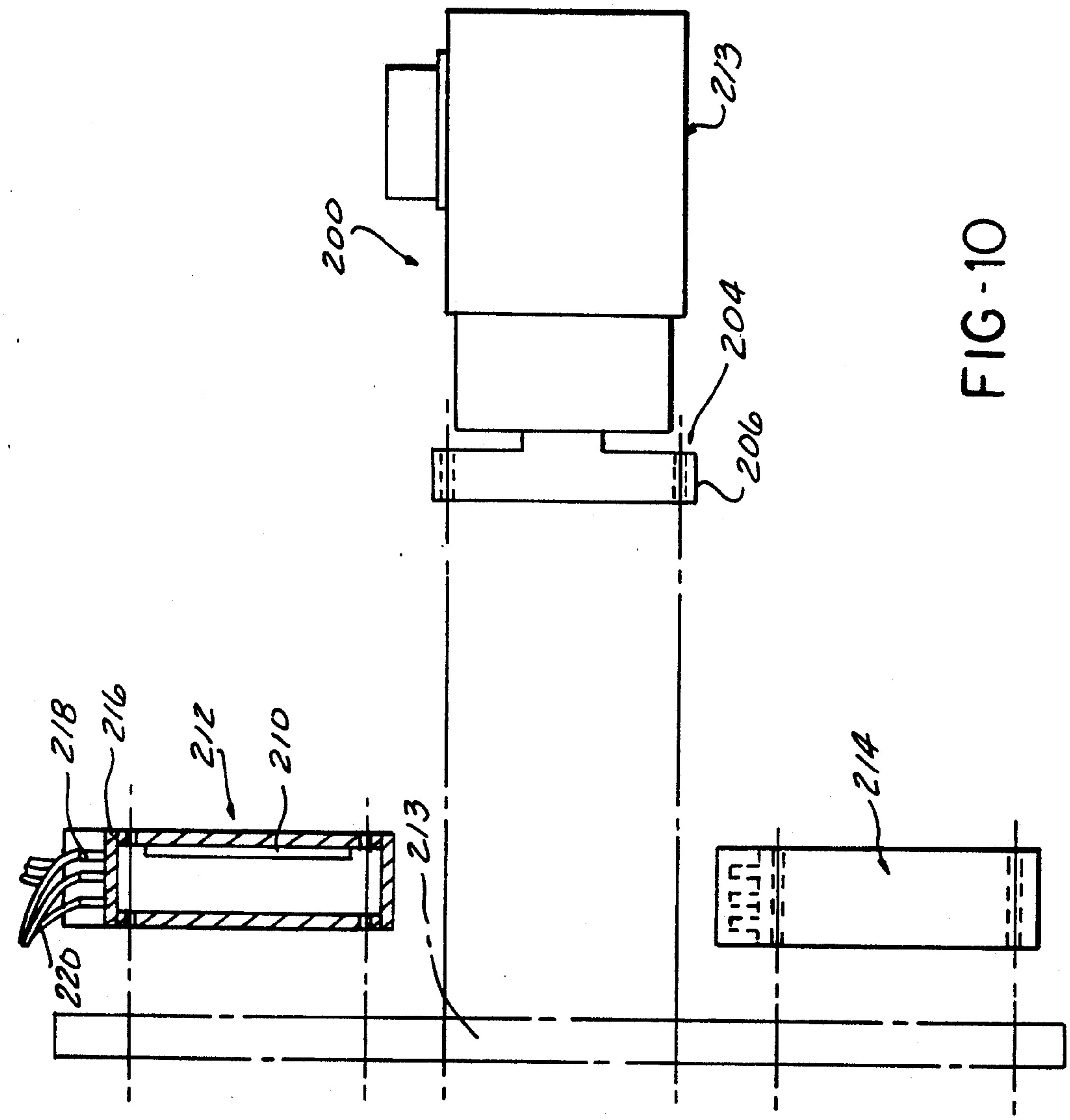
FIG. 10 is a partially cross sectioned, exploded elevational view showing yet another embodiment of the present invention.

Alternately, as shown in FIG. 10 the housings containing the sensor output amplifier(s) and power supply circuit(s) may be mounted at radially spaced positions on the rotating member 213 from the connection location of the rotor 204 of the slip ring 200 to the rotating member 213. In this embodiment, the rotor 204 of the slip ring 200 is directly connected to the rotating member 213 so as to be rotatable therewith. One or more housings 212, 214, etc., are mounted at radially spaced portions, such as circumferentially about the periphery of the rotating member 213 on or an end plate or cover, not shown, attached to the rotating member 213. In this manner, the housings 212, 214, etc., are rotatable with the rotating member 213 in the same manner as is the rotor 204 of the slip ring 200. Leads 220 from the sensors mounted on the rotating member 213 are connected to the circuits mounted in the housings 212 and 214 and similar leads extend from such circuits to the rotor contacts in the slip ring 200 to provide a transmission path for the amplified sensor output signals to the remotely located data acquisition unit 14.

In summary, there has been disclosed a unique rotating electrical signal generating data acquisition apparatus in which an amplifier is uniquely mounted on the rotating side of a slip ring in a housing attached to a rotating member and connected to a sensor mounted on the rotating member to amplify the output of the sensor. The amplified signal is transmitted through the slip ring to a remote data acquisition unit and, since it has been amplified many times from the normal low level sensor output, electrical noise from external sources, which has previously caused erroneous data signals, is effectively eliminated. When required, the apparatus of the present invention also employs unique vibration isolation means to effectively mount the amplifier and sensor excitation and power supply circuits on the rotating side of the slip ring and to prevent vibrations from damaging such circuits.

What is claimed is:

1. A rotating electrical signal generating sensor data acquisition apparatus for use in collecting sensor output data relating to predetermined operating parameters of a rotating member, the apparatus comprising:

stator means;

stator contact means, mounted on the stator means and electrically connected to a data acquisition means;

rotor means connected to the stator means and fixedly connected to a rotating member so as to be rotated therewith;

rotor contact means mounted on the rotor means and electrically connected to the stator contact means;

a housing fixedly connected to and rotated with the rotating member; and amplifier means, mounted in the housing and electrically connected to a sensor mounted on the rotating member and to the rotor contact means, for amplifying electrical signals generated by the sensor.

2. The apparatus of claim 1 wherein:

the stator and rotor contact means comprise at least one contact ring and at least one brush, at least one of the contact ring and the brush mounted on the stator means and the other of the contact ring and brush mounted on the rotor means.

3. The apparatus of claim 1 further comprising:

a plurality of sensors mounted on the rotating member, each determining a distinct operating parameter of the rotating member; and a plurality of amplifier means mounted in the housing, each of the plurality of amplifier means being connected to a separate sensor.

4. The apparatus of claim 1 further comprising:

calibration resistor means connected to the sensor mounted on the rotating member; and means for selectively connecting the calibration resistor means to the sensor to drive an output of the sensor to a predetermined magnitude.

5. The apparatus of claim 4 wherein the connecting means comprises:

transistor means, responsive to an input signal, for connecting the calibration resistor means to shunt across the sensor.

6. The apparatus of claim 1 wherein the amplifier means comprises a differential input, single output amplifier.

7. The apparatus of claim 6 wherein:

the sensor is a thermocouple having a pair of leads connected to the differential inputs of the amplifier; and further including cold junction compensation means for providing an offset signal to the amplifier corresponding to the temperature of the junction between the thermocouple leads and the amplifier.

8. The apparatus of claim 1 further comprising:

sensor excitation power generating means, mounted in the housing, for supplying excitation power to the sensor.

9. The apparatus of claim 7 wherein the sensor includes a resistive bridge.

10. The apparatus of claim 1 wherein the amplifier means is mounted on a printed circuit board mounted in the housing.

11. The apparatus of claim 10 further comprising:

slip ring and circuit board vibration isolation means mounted in the housing and resiliently contacting the circuit board for dampening vibrations generated by the rotating member and the housing.

12. The apparatus of claim 11 wherein the vibration isolation means comprises:

a support plate disposed in the housing and supporting the printed circuit board thereon; and resilient pad means, mounted on the peripheral edge of the support plate and engaging the housing and exhibiting spring characteristics, for isolating the circuit board from vibrations acting through the housing.

13. The apparatus of claim 12 wherein the resilient pad means comprises a plurality of resilient pads spacedly mounted about the periphery of the support plate and engaging the housing.

14. The apparatus of claim 12 wherein the vibration isolation means further comprises:

means for resiliently mounting the printed circuit board to the support plate.

15. The apparatus of claim 14 wherein the means for resiliently mounting the circuit board to the support plate comprises:

resilient bumper means, mounted on and extending outward from at least one surface of the support plate, for resiliently contacting the housing, the bumper means engaging a peripheral portion of the circuit board.

16. The apparatus of claim 15 wherein the resilient bumper means comprises a plurality of resilient bumpers spacedly mounted on and extending outward from at least one surface of the support plate into engagement with the housing.

17. The apparatus of claim 15 wherein the resilient bumper means comprises a plurality of resilient bumpers spacedly mounted on and extending outward from both sides of the support plate into engagement with the housing.

18. The apparatus of claim 11 wherein the vibration isolation means further comprises:

a support plate disposed in the housing; and means for resiliently mounting the printed circuit board to the support plate.

19. The apparatus of claim 18 wherein the means for resiliently mounting the circuit board to the support plate comprises:

resilient bumper means, mounted on and extending outward from at least one surface of the support plate, for resiliently contacting the housing, the bumper means engaging a peripheral portion of the circuit board.

20. The apparatus of claim 19 wherein the resilient bumper means comprises a plurality of resilient bumpers spacedly mounted on and extending from at least one surface of the support plate into engagement with the housing.

21. The apparatus of claim 19 wherein the resilient bumper means comprises a plurality of resilient bumpers spacedly mounted on and extending outward from both sides of the support plate into engagement with the housing.

22. The apparatus of claim 1 further comprising:

a data acquisition means electrically connected to the stator contact means, for acquiring data generated by the sensor and amplified by the amplifying means.

23. The apparatus of claim 22 further comprising:

pre-digitizing filter means connected between the stator contact means and the data acquisition means for filtering the amplified output of the sensor.

24. The apparatus of claim 1 wherein:

the housing having the amplifier means mounted therein is separate from the rotor means and is co-axially mounted between the rotor means and the rotating member.

25. The apparatus of claim 24 further including:

a plurality of housings, each having amplifier means mounted therein, co-axially mounted between the rotor means and the rotating member.

26. The apparatus of claim 1 wherein the housing having the amplifier means mounted therein is separate from the rotor means and is fixedly connected to the rotating member at a radially spaced location on the rotating member from the mounting of the rotor means to the rotating member.

27. The apparatus of claim 26 further including:

a plurality of housings circumferentially spaced about and mounted to the rotating member at radially spaced locations from the mounting of the rotor means to the rotating member.

28. A method of transferring electrical signals corresponding to certain operating parameters of a rotating member to a remote data acquisition means comprising the steps of:

mounting a sensor on a rotating member to determine an operating parameter of the rotating member, the sensor generating electrical signals indicative of an operating parameter;

mounting amplifier means in a housing fixedly connected to the rotating member;

electrically connecting the amplifier means to the sensor to amplify the signal generated by the sensor;

connecting the housing to a rotor means, the rotor means being coupled to a stationary stator means;

electrically connecting the amplifier means to a rotor contact in the rotor means; and electrically connecting a stator contact in the stator means to the rotor contact and to a data acquisition means remotely located from the stator means.

29. The method of claim 28 further including the steps of:

connecting two differential outputs from the sensor to the amplifier means; and providing a signal output from the amplifier means to the rotor contact.

* * * * *

UNITED STATES PATENT AND TRADEMARK OFFICE
CERTIFICATE OF CORRECTION

PATENT NO. : 5,231,374

DATED : July 27, 1993

INVENTOR(S) : Hugh W. Larsen et al.

It is certified that error appears in the above-identified patent and that said Letters Patent is hereby corrected as shown below:

Column 11, line 60, please delete "2121" and insert --212--.

Signed and Sealed this

Fifth Day of April, 1994

Attest:

BRUCE LEHMAN

Attesting Officer

Commissioner of Patents and Trademarks